(12) United States Patent
Redaelli et al.

(10) Patent No.: US 8,243,516 B2
(45) Date of Patent: Aug. 14, 2012

(54) INTERFACE FOR NAND-TYPE FLASH MEMORY

(75) Inventors: Marco Redaelli, Carate Brianza (IT); Oreste Bernardi, Munich (DE)

(73) Assignee: Qimonda AG, Munich (DE)

( * ) Notice: Subject to any disclaimer, the term of this patent is extended or adjusted under 35 U.S.C. 154(b) by 0 days.

(21) Appl. No.: 12/052,414

(22) Filed: Mar. 20, 2008

(65) Prior Publication Data
US 2009/0238001 A1    Sep. 24, 2009

(51) Int. Cl.
*G11C 11/34* (2006.01)
(52) U.S. Cl. .................................................. 365/185.17
(58) Field of Classification Search .............. 365/185.17
See application file for complete search history.

(56) References Cited

U.S. PATENT DOCUMENTS

| 6,791,898 B1 * | 9/2004 | Manapat et al. ......... 365/233.11 |
| 2004/0017708 A1 * | 1/2004 | Choi et al. .................... 365/200 |

* cited by examiner

*Primary Examiner* — Hoai V Ho
*Assistant Examiner* — Anthan Tran (57) ABSTRACT

A NAND-type flash memory device is described. In some embodiments, the memory device includes NAND-type flash memory cells, and a synchronous NAND interface. The synchronous NAND interface includes a standard NAND flash interface pin arrangement and a clock (CLK) pin. The synchronous NAND interface is configured to interface with a NOR-compatible memory interface.

23 Claims, 9 Drawing Sheets

Configuration Register

| | Bit 7 | Bit 6 | Bit 5 | Bit 4 | Bit 3 | Bit 2 | Bit 1 | Bit 0 |
|---|---|---|---|---|---|---|---|---|
| Byte 0 | RFU | RFU | RFU | RFU | RFU | ES | PS | |
| Byte 1 | RFU | RFU | RFU | RFU | EM | | OI | |
| Byte 2 | RFU | CC | LC | | | DH | WD | WP |

Configuration Register Commands ↗ 22

| Command | Cycle Number | Cycle | | | | | | |
|---|---|---|---|---|---|---|---|---|
| | | 1st | 2nd | 3rd | 4th | 5th | 6th | 7th |
| Write Configuration Register | 4 to 6 | 55 | AA | 01h or 02h or 03h (command) | Data Byte 0 | Data Byte 1 | Data Byte 2 | x |
| Read Configuration Register | 6 | 55 | AA | 00h | Data Byte 0 | Data Byte 1 | Data Byte 2 | x |
| Reset | 1 | FFh | x | x | x | x | x | x |

Read Commands

| Command | Cycle Number | Cycle | | | | | | | |
|---|---|---|---|---|---|---|---|---|---|
| | | 1st | 2nd | 3rd | 4th | 5th | 6th | 7th | 8th...Nth |
| Read | 7 | 00h | Address Byte 0 (Column) | Address Byte 1 (Column) | Address Byte 2 (Row) | Address Byte 3 (Row) | Address Byte 4 (Row) | 30h | Data Output |
| Read for Copy-Back | 7 | 00h | Address Byte 0 (Column) | Address Byte 1 (Column) | Address Byte 2 (Row) | Address Byte 3 (Row) | Address Byte 4 (Row) | 35h | x |
| Read Status | 1 | 70h | x | x | x | x | x | x | x |
| Read ID | 1 | 90h | x | x | x | x | x | x | x |
| Random Data Output | 4 | 05h | Address Byte 0 (Column) | Address Byte 1 (Column) | E0h | x | x | x | x |

Program and Erase Commands

| Command | # of Cycle | Cycle | | | | | | | |
|---|---|---|---|---|---|---|---|---|---|
| | | 1st | 2nd | 3rd | 4th | 5th | 6th | 7th...(N-1)th | Nth |
| Page Program | 7 | 80h | Address Byte 0 (Column) | Address Byte 1 (Column) | Address Byte 2 (Row) | Address Byte 3 (Row) | Address Byte 4 (Row) | Data Input | 10h |
| Copy-Back Program | 7 | 85h | Address Byte 0 (Column) | Address Byte 1 (Column) | Address Byte 2 (Row) | Address Byte 3 (Row) | Address Byte 4 (Row) | Data Input | 10h |
| Random Data Input | 4 | 85h | Address Byte 0 (Column) | Address Byte 1 (Column) | Data Input | | | | |
| Block Erase | 5 | 60h | Address Byte 0 (Row) | Address Byte 1 (Row) | Address Byte 2 (Row) | D0h | x | x | x |

FIG 7  Read Command Sequence issued in Asynchronous mode followed by synchronous burst data output FIG 8  Read Command Sequence issued in Asynchronous mode followed by synchronous single data output FIG 10  Synchronous Burst Read interrupted by CE#

FIG 11

WAIT Behavior

| Condition | Wait behavior |
|---|---|
| CE# = VIH | High Z |
| CE# = VIL | Driven |
| RE# = VIH | Driven |
| RE# = VIL when CE# = VIL | Driven |
| Single Synchronous Reads & Burst Reads | Active |
| All Asynchronous Reads and Writes | De-asserted |

INTERFACE FOR NAND-TYPE FLASH MEMORY

TECHNICAL FIELD

Various embodiments of the invention relate generally to flash memory, and in particular to an interface for NAND-type flash memory.

BACKGROUND

Conventional NAND-type flash memory is used in many applications for its ability to store information in a non-volatile manner, as well as its relatively high density (and capacity) and relatively low cost. However, NAND flash memory is typically accessed in a block-wise manner, through an asynchronous interface. This makes it unsuitable for some applications, such as applications where random byte/word access to the memory is desirable.

Other types of flash memory, such as conventional NOR-type flash memory may permit random access, but typically have a lower density (and, hence, capacity) and higher cost as compared to NAND flash. Additionally, a typical NOR flash memory has a synchronous interface.

Due in part to differences in their interfaces, conventional NAND flash memory cannot typically be substituted for NOR flash memory, to take advantage of its lower cost and higher capacity. Most applications that employ NAND flash use a microprocessor or host controller that is compatible with the interface of a NAND flash memory, or that is programmed to access a NAND flash memory through a "standard" NAND flash memory interface. Similarly, applications that use NOR flash memory typically use a microprocessor or host controller that is compatible with the interface of a NOR flash memory, or that is programmed to use a NOR flash memory through a "standard" NOR flash interface.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DETAILED DESCRIPTION OF ILLUSTRATIVE EMBODIMENTS

In accordance with an embodiment of the invention, a synchronous NAND flash memory device may be provided, having an interface that may be used with a NOR compatible microprocessor without requiring substantial additional glue logic. In some embodiments, this may be achieved by adding extra CLK (clock) and WAIT pins to a NAND flash interface to provide a synchronous NAND interface. This approach may allow designers increased flexibility in providing a high speed connection to a mass storage device, and may achieve increased read performance while maintaining a high degree of backward compatibility.

Figure 1:
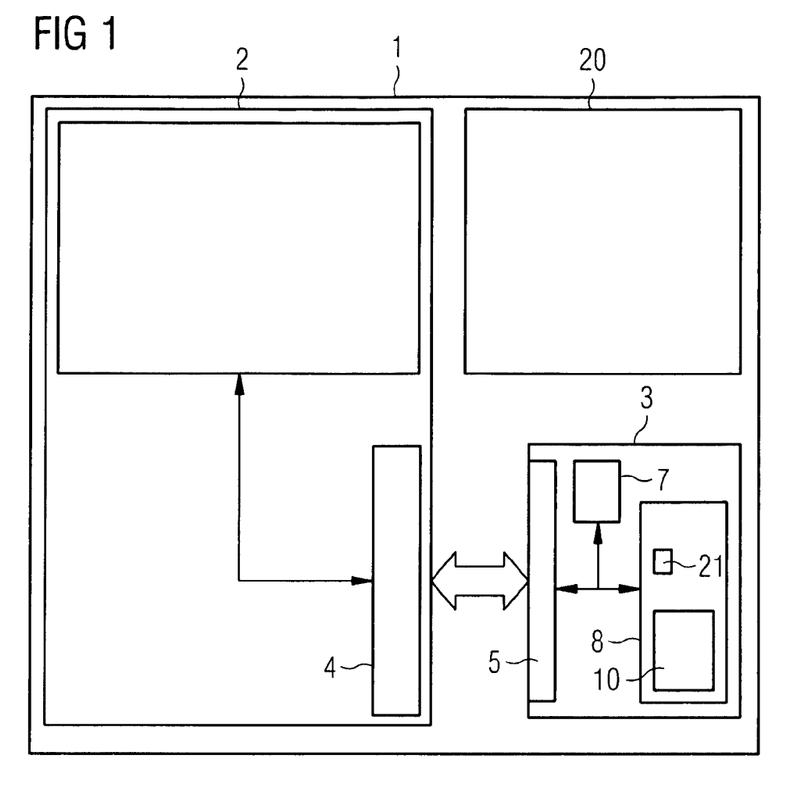
FIG. 1 illustrates an embodiment of an electronic device having a host microprocessor and a NAND-type flash memory device.

FIG. 1 illustrates an embodiment of an electronic device 1. The electronic device 1 may include a host controller 2, a NAND-type flash memory device 3 and application hardware 20. The host controller 2 may be, for example, a NOR-compatible processor including a NOR-compatible memory interface 4 that uses a "standard" NOR-compatible protocol to access memory. The NAND-type flash memory device 3 may have NAND-type memory cells, which would normally be accessed using a NAND-compatible interface and NAND-compatible protocol for memory access. In accordance with an embodiment of the invention, the NAND-type memory 3 includes a synchronous NAND interface 5, which may be arranged to connect to the NOR-compatible memory interface 4, and to operate responsive to a NOR-compatible protocol without using glue logic.

In some embodiments, the NAND-type flash memory device 3 may include an onboard controller 7, the synchronous NAND interface 5 for communicating with the host controller 2, and memory cells 8. The memory cells 8 may include mass storage 10, for example, an array of NAND-type memory cells. The memory cells 8 also may include a configuration register 21. The configuration register 21 may include data representative of whether the NAND-type memory cell 3 operates in an asynchronous mode or in a synchronous mode, as well as other configuration information relating to the NAND-type flash memory device 3. The mode in which the NAND-type memory 3 operates may be determined, in part, on whether the memory 3 is being used in conjunction with a NOR-compatible host controller 2 or a NAND-compatible host controller.

In some embodiments, the synchronous NAND interface 5 (which will be described in greater detail below) may include "standard" NAND-interface pins as well as at least one additional pin, for example a CLK pin and/or a WAIT pin. Because the synchronous NAND interface 5 includes the "standard" NAND interface, it retains compatibility with a processor or host controller that includes a NAND-compatible memory interface. Because it includes the extra CLK and/or WAIT pins, the synchronous NAND interface may be compatible with a processor or host controller that has a "standard" NOR-compatible memory interface. The type of memory interface used will depend at least in part on how the synchronous NAND interface 5 is connected, and on the mode set in the configuration register 21.

In some embodiments, the device 1 may include application hardware 20. The application hardware 20 may depend on what type of application the device 1 is to be used for, and may include a wide variety of input/output devices or other application-specific hardware. For example, the device 1 may be a cell phone, in which case the application hardware 20 may include typical hardware components used by a cell phone, such as an LCD display, a keypad, and cellular communication hardware. In other embodiments, the device 1 may be other common electronic devices that use flash memory, such as a digital camera, a music or media player, a PDA, a portable game device, or any other electronic device that typically uses NAND or NOR-type flash memory. In each such case, the application hardware 20 will include a variety of application-specific hardware components.

Figure 2:
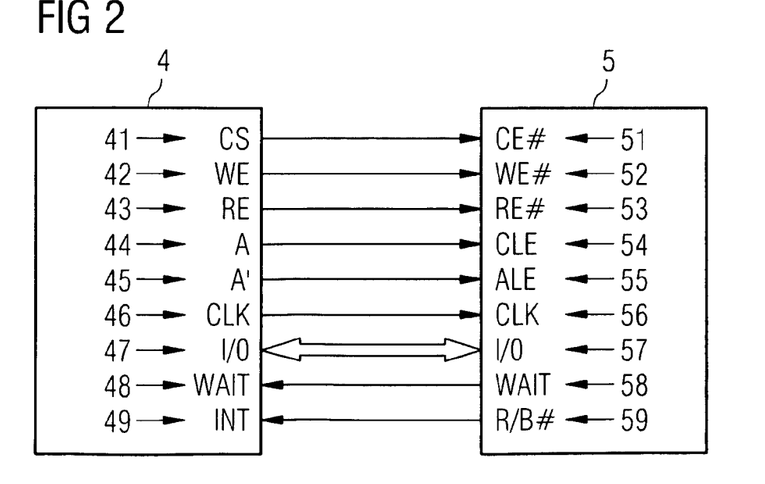
FIG. 2 illustrates an embodiment of an electronic device having a host microprocessor and a NAND-type flash memory device.

FIG. 2 illustrates an embodiment of a connection between the NOR-compatible memory interface 4 and the synchronous NAND interface 5. In accordance with an embodiment of the invention, the synchronous NAND interface 5 is compatible with both a NOR-protocol and a NAND-protocol without using glue logic. This may permit a system designer to provide NAND-type mass memory storage without having to provide an additional NAND compatible bus controller or other glue logic on a NOR-compatible microprocessor. Use of a NAND flash device having a synchronous NAND interface, such as is shown in FIG. 2, may provide more flexibility for a designer and may be compatible with either a NAND-compatible or a NOR-compatible host microprocessor. Interfacing a NOR-compatible host microprocessor with a NOR/NAND-compatible memory device without glue logic may provide higher memory density and possibly lower cost than using a NOR-type flash memory device with the NOR-compatible host microprocessor.

In some embodiments, the synchronous NAND interface 5 includes numerous contact pins (though it will be understood that any kind of electrical contact may be used) for communicating with the NOR-compatible memory interface 4. The synchronous NAND interface 5 may include pins that are present in a "standard" NAND-type interface. For example, the NAND-type memory may include a chip enable pin (CE#) 51, write enable pin (WE#) 52, read enable pin (RE#) 53, command latch enable pin (CLE) 54, address latch enable pin (ALE) 55, a plurality of I/O pins (I/O) 57, and a ready/busy (R/B#) pin 59. The CE#, WE#, RE#, CLE, ALE, I/O and R/B# pins may be industry-standard NAND-type memory device interface pins and may perform functions compatible with a "standard" NAND-compatible interface.

Additionally, the synchronous NAND interface 5 may include at least one or two additional pins not present in a standard NAND-type memory device. For example, synchronous NAND interface 5 may include a clock pin (CLK#) 56 and a wait (WAIT#) pin 58.

In some embodiments, the NOR-compatible memory interface 4 may include contact pins 41-49, which are present in a "standard" NOR-compatible memory interface, such as an interface for connecting to a "standard" NOR-type flash memory for use in wireless devices. For example, the synchronous NAND interface 5 may include a chip select pin (CS) 41, a write enable pin (WE) 42, a read enable pin (RE) 43, numerous address pins including, for example, A 44 and A' 45, a clock pin (CLK) 46, I/O pins (I/O) 47, a wait pin (WAIT) 48 and an interrupt (INT) pin 49. In some embodiments, the two address lines A, A' may be connected to the CLE and ALE pins of the NAND-type memory. For example, address lines A[8] and A[9] of a NOR-compatible interface 4 may correspond to A and A', respectively. The address line signals from pins A 44 (for example, A[8]) and A' 45 (A[9]) may be used to provide control signals to the CLE pin 56 and ALE pin 57, respectively. The other address lines of the NOR-compatible interface 4 are, in this example, not connected.

In some embodiments, as shown in FIG. 2, the CS pin 41 of the NOR-compatible interface 4 may be connected to the CE# pin 51 of the synchronous NAND interface 5. Similarly, the WE pin 42 may be connected to the WE# pin 52, the RE pin 43 may be connected to the RE# pin 53, and the INT pin 49 may be connected to the R/B# pin 59.

In some embodiments, two address lines A 44 and A' 45 of the NOR-compatible interface 4 may be used to provide control signals to the CLE pin 54 and ALE pin 55 of the synchronous NAND interface 5. In some embodiments, controlling the CLE pin 54 and ALE pin 55 using address lines A 44 and A' 45 may provide for controlling the Address and Control protocol of a "standard" NAND flash memory device by using "standard" NOR read and write operations to particular address offsets or ranges. For example, the A pin 44 may be the A[8] line of a standard NOR-compatible interface 4 (i.e., bit 8 of the address), and be connected to the CLE pin 54 of the synchronous NAND interface 5. Similarly, the A' pin 45 may be the A[9] line (i.e., bit 9 of the address), and may be connected to the ALE pin 55 of the synchronous NAND interface 5. Because the NAND interface is a serial interface, not all of the address lines of the NOR interface may need to be connected. Fewer interface pins (for example, 2) may be used than might otherwise be used in a in a standard interface between a NOR-compatible processor and a NOR-type flash memory device.

Using this example arrangement of address lines (i.e., A[8] and A[9] connected to CLE and ALE, respectively, with other address lines not connected) when an address in the range 200h-2FFh (i.e., hexadecimal addresses 200-100000000 in binary, through hexadecimal 2FF-101111111 in binary) is placed on the address pins of the NOR-compatible interface 4, the CLE pin (corresponding to A[8]) of the synchronous NAND interface 5 will be low (0), and the ALE pin (corresponding to A[9]) will be high (1). Similarly, when an address in the range 100h-1FFh (0100000000-0111111111 in binary) is placed on the address pins of the NOR-compatible interface 4, the CLE pin (corresponding to A[8]) of the synchronous NAND interface 5 will be high (1), and the ALE pin (corresponding to A[9]) will be low (0). As will be seen below, this sets up a kind of "virtual address space" that can be used to send serial NAND commands across the NOR-compatible interface 4.

Figure 3:
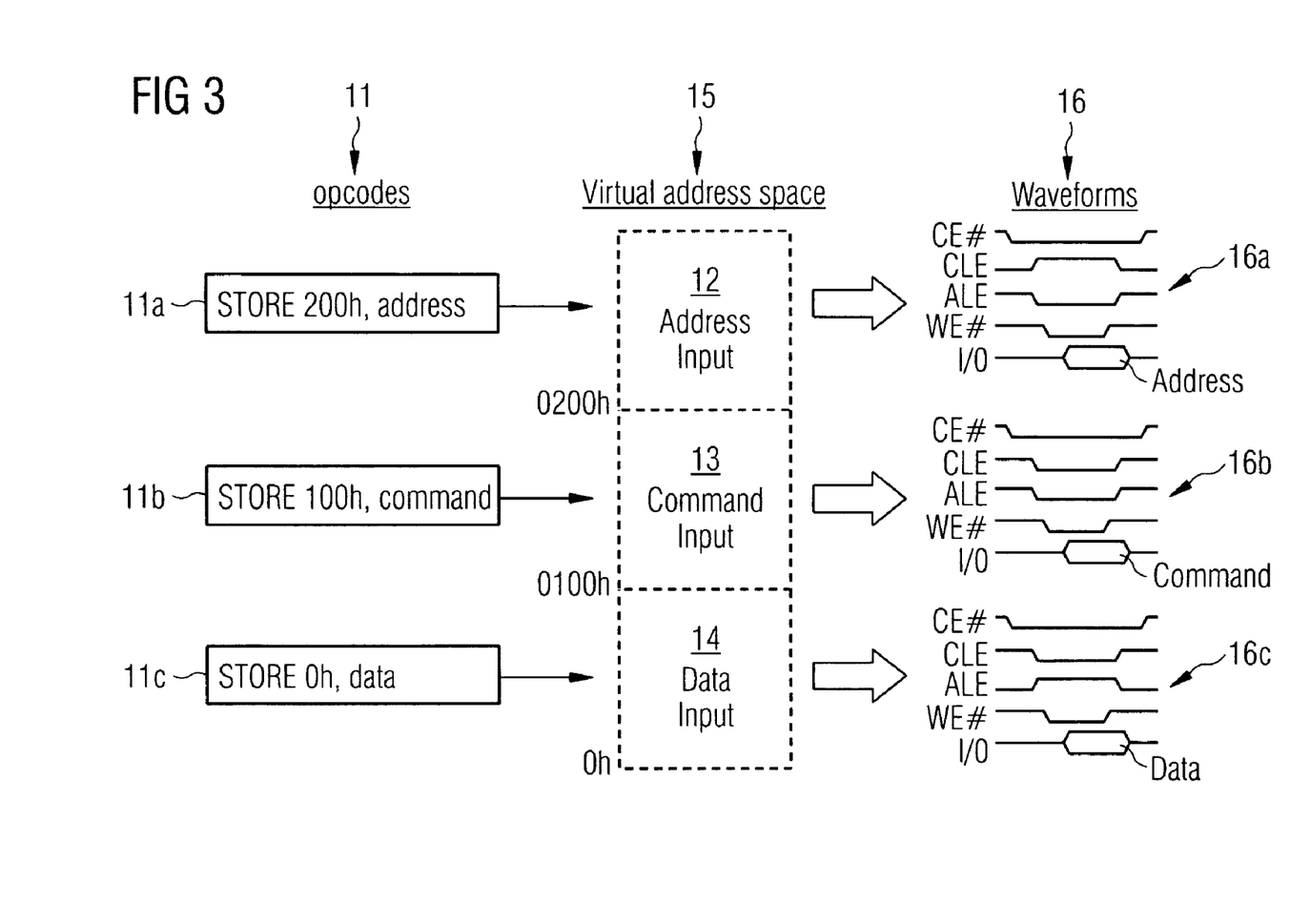
FIG. 3 illustrates an embodiment of NOR-compatible operational, example virtual address spaces and waveforms.

FIG. 3 illustrates use of a "virtual address space" to provide NAND commands to a NAND interface using standard NOR commands or opcodes sent through a NOR-compatible interface. In the example shown in FIG. 3, it is assumed that the A[8] line of the NOR interface is connected to the CLE pin of the NAND interface, and the A[9] line of the NOR interface is connected to the ALE pin of the NAND interface, as shown above in FIG. 2.

As shown in FIG. 3, in some embodiments, using "standard" NOR commands or opcodes 11, applying the "virtual address space" 15 created by connecting the A[8] line to the CLE pin and the A[9] line to the ALE pin, the waveforms 16 for a "standard" NAND protocol may be produced.

In a "standard" NAND protocol, when the ALE (address latch enable) line is asserted, the data on the data pins are address data. When the CLE (command latch enable) pin is asserted, the data on the data pins are command data. When neither the ALE nor CLE pins are asserted, the data lines contain data to be read or written. Thus, the virtual address space 15 can be seen as being divided into three "regions". A "data input" region 14 occupies the virtual address space having addresses 0h-FFh, in which neither the A[8] nor A[9] lines (i.e. neither CLE nor ALE) are asserted. A "command input" region 13 occupies the virtual address space having addresses 100h-1FFh, in which the A[8] line (connected to CLE) is high, and the A[9] line (connected to ALE) is low. An "address input" region 12 occupies the virtual address space having addresses 200h-2FFh, in which the A[8] line (connected to CLE) is low, and the A[9] line (connected to ALE) is high. Using this address mapping scheme, for example, a NOR command writing data to address 100h would cause the NAND interface to take the data on the data lines to be a command.

Thus, the "STORE 200h, address" opcode 11a is a standard HOST command to store data (here an "address") to the memory location 200h. Mapped through the virtual address space 15, this produces the waveform 16a on the NAND interface, causing the "address" value on the data lines to be viewed as an address by the NAND device (i.e., because ALE is high and CLE is low). The "STORE 100h, command" opcode 11b produces waveform 16b, causing the NAND device to view the value on the data lines (here labeled "command") as a command (ALE is low and CLE is high). The "STORE 0h, command" opcode 11c produces waveform 16c, causing the NAND device to interpret the value on the data lines (labeled "data") as data (since ALE is low and CLE is low).

In some embodiments, the following NAND-compatible operational codes may accomplish reading a page from NAND-type flash memory when the when the NOR memory interface pins are connected to the memory interface pins as illustrated in FIG. 2:

It should be noted that in some embodiments, read operations may be performed on a NAND-type memory by either an asynchronous NOR-compatible operational code protocol a synchronous NOR-compatible protocol (e.g., synchronous burst access), or by a NAND-compatible protocol. In some embodiments, if the read operation is asynchronous, then the state of the CLK signal does not matter. For a synchronous read operation, as will be described in greater detail below, the data output is synchronized with the clock signal on the CLK pin. The read mode and format of the data output may be determined by the configuration register, described in greater detail below, with reference to FIG. 4.

Configuration Register

Figure 4:
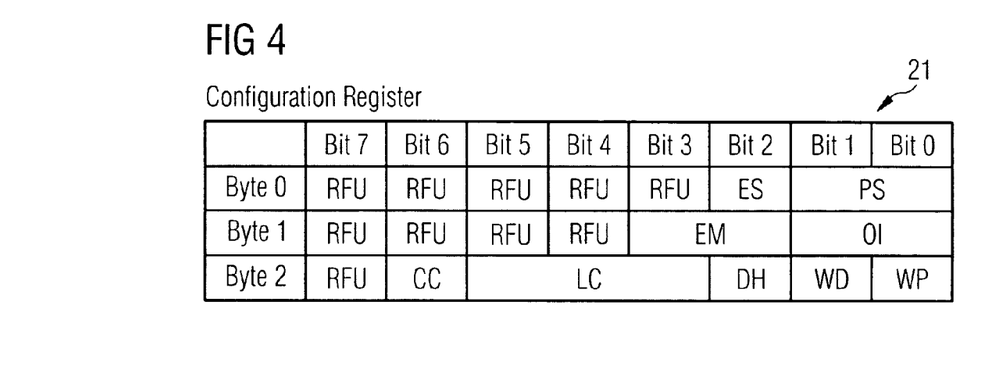
FIG. 4 illustrates an embodiment of a configuration register.

FIG. 4 illustrates an embodiment of a configuration register 21. In some embodiments, the configuration register 21 stores data representative of a mode in which the NAND-type flash memory will operate. The configuration register 21 may include numerous bits and/or bytes of configuration information, for example three bytes of 8 bits each. In the following description, the location of each individual bit within the register is designated by two digits A/B, where A is indicative of the byte number and B is indicative of the bit number within that byte.

In some embodiments, the configuration register may include data representative of the clock configuration (CC), stored, for example, at location 2/6. The CC bit may define whether operations in a synchronous mode are synchronized and referenced to a rising or falling clock edge. For example, a CC bit value of 0 may correspond to data being latched on a falling clock edge, while a CC bit value of 1 may correspond to data being latched on a rising clock edge. In some embodiments, the default value may be 1.

| | |
|---|---|
| STORE 100$_H$, 00$_H$ | ; write 0x00$_H$ with A8/CLE high, A9/ALE low |
| STORE 200$_H$, (add#1)$_H$ | ; write address #1 with A8/CLE low, A9/ALE high |
| STORE 200$_H$, (add#2)$_H$ | ; write address #2 with A8/CLE low, A9/ALE high |
| STORE 200$_H$, (add#3)$_H$ | ; write address #3 with A8/CLE low, A9/ALE high |
| STORE 200$_H$, (add#4)$_H$ | ; write address #4 with A8/CLE low, A9/ALE high |
| STORE 200$_H$, (add#5)$_H$ | ; write address #5 with A8/CLE low, A9/ALE high |
| STORE 100$_H$, 30$_H$ | ; write 0x30$_H$ with A8/CLE high, A9/ALE low |
| WFI | ; wait for interrupt (R/B pin to return high) |
| LOADM (dest address),0 | ; copy n bytes from NAND into destination memory |
| LOADM (dest address+n),0 | ; copy n bytes from NAND into destination memory |
| LOADM (dest address+2n),0 | ; copy n bytes from NAND into destination memory |
| LOADM (dest address+3n),0 | ; copy n bytes from NAND into destination memory |
| LOADM (dest address+4n),0 | ; copy n bytes from NAND into destination memory |
| ... continue until full page is read. | |

In some embodiments, the following NAND-compatible opcodes may accomplish writing a page to a NAND-type flash memory when the NOR memory interface pins are connected to memory interface pins as illustrated in FIG. 2:

In some embodiments, the configuration register may include data representative of a first access latency count (LC) which may be stored, for example, at locations 2/5 through 2/3. When operating in the synchronous mode, the LC data bit

| | |
|---|---|
| STORE 100$_H$, 80$_H$ | ; write 0x80$_H$ with A8/CLE high, A9/ALE low |
| STORE 200$_H$, (add#1)$_H$ | ; write address #1 with A8/CLE low, A9/ALE high |
| STORE 200$_H$, (add#2)$_H$ | ; write address #2 with A8/CLE low, A9/ALE high |
| STORE 200$_H$, (add#3)$_H$ | ; write address #3 with A8/CLE low, A9/ALE high |
| STORE 200$_H$, (add#4)$_H$ | ; write address #4 with A8/CLE low, A9/ALE high |
| STORE 200$_H$, (add#5)$_H$ | ; write address #5 with A8/CLE low, A9/ALE high |
| STOREM 00$_H$, (data#0)$_H$ | ; copy n bytes from source memory to NAND |
| STOREM 00$_H$, (data#n)$_H$ | ; copy n bytes from source memory to NAND |
| STOREM 00$_H$, (data#2*n)$_H$ | ;copy n bytes from source memory to NAND |
| ... | |
| ; continue until full page is written | |
| ... | |
| STORE 100$_H$, 10$_H$ | ; write 0x10$_H$ with A8/CLE high, A9/ALE low | value may be indicative of the number of "dummy" clock cycles to be inserted before a valid clock edge when data is to be latched. The latency mode may be adjusted to a desired burst frequency. Depending on the programmed latency, driving $1^{st}$ data may be delayed by the number of clock cycles as specified in this field counting from a first clock edge. For example, the LC bit data values may be one of the following:

000=Reserved for Future Use
001=1 clock cycle
010=2 clock cycles
011=3 clock cycles
100=4 clock cycles
101=5 clock cycles
110=6 clock cycles
111=Reserved for future use (Default value)

In some embodiments, the configuration register may include data hold (DH) data representative of whether a data word remains valid on the data bus for one or two clock cycles. The DH bit value may be stored, for example, at location 2/2. The DH bit value may be valid for synchronous read operations only. In some embodiments, a microprocessor's minimum data set-up time and the NAND-type flash memory's clock-to-data delay may determine whether one or two clock cycles are used. For example, the DH bit value set at 1-clock cycle may correspond to a 1-clock data cycle. A DH bit value set at 2-clock cycles may correspond to a 2-clock cycle data cycle. The setting of the DH bit value may depend on the system and microprocessor characteristics. In some embodiments, the DH bit values may be:

0=Hold Data for one clock cycle

1=Hold Data for two clock cycles

In some embodiments, the default DH bit value may be 1.

In some embodiments, the configuration register may include data representative of a WAIT Delay (WD). The WD value may be stored, for example, at location 2/1. When operating in a synchronous mode, the WD bit value may be indicative of whether WAIT is to be de-asserted with valid data, or one data cycle before the valid data. For example, a WE bit value of 0 may be indicative of WAIT de-asserted with valid data and a WE bit value of 1 may be indicative of WAIT to be de-asserted one data cycle before valid data. In some embodiments, the default value may be 1.

In some embodiments, the configuration register may include data representative of WAIT polarity (WP). The WP data may be stored, for example, at data location 2/0. The WP bit value may be indicative of whether the WAIT signal is active low or whether the WAIT signal is active high (default). For example, a WP bit value of 0 may indicate that the WAIT signal is active low and a WP bit value of 1 may indicate that the WAIT signal is active high. In some embodiments, the default WP bit value may be 1.

In some embodiments, the configuration register may include data representative of Execution Mode (EM). The EM data may be stored, for example, at locations 1/3 through 1/2. The EM bit value may indicate whether a NAND-type flash memory is to be operated in an asynchronous mode, for example, with a standard NAND asynchronous interface protocol, or in a synchronous mode, for example, operating in conjunction with a NOR-compatible microprocessor and/or a NOR-compatible interface protocol. For example, an EM bit value of 00 may be indicative of asynchronous mode operation and a value of 10 may be indicative of synchronous mode operation. The bit values of 01 and 11 may be reserved for future use.

In some embodiments, the configuration register may include data indicative of output impedance (OI). The OI data may be used, for example, in conjunction with I/O operations. The OI bit value may be stored, for example, at locations 1/1 through 1/0.

In some embodiments, the configuration register may include data indicative of erase speed (ES). The ES data may be stored, for example, at location 0/2. The ES bit value may be used, for example, during erase operations.

In some embodiments, the configuration register may include data representative of program speed (PS). The PS data may be stored, for example at locations 0/1 through 0/0.

Figure 5:
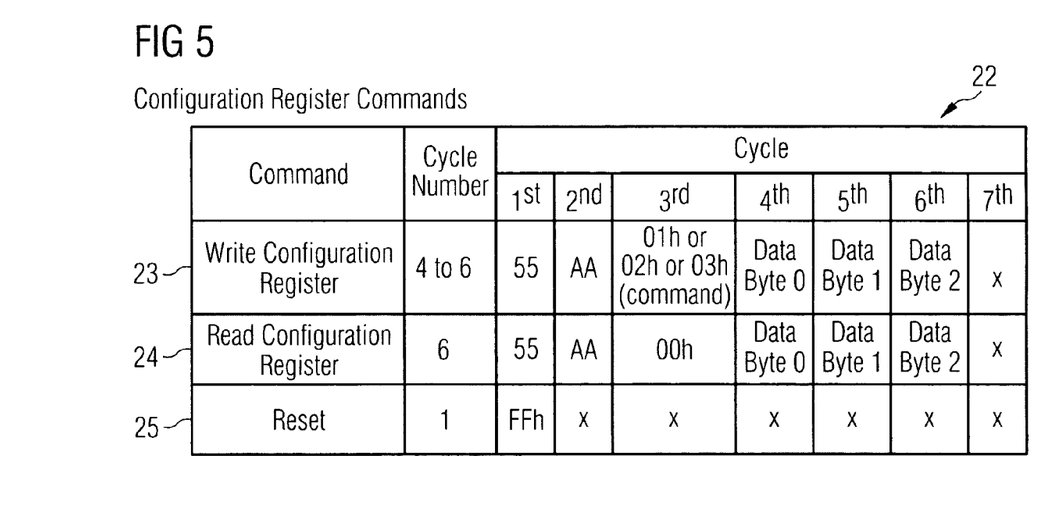
FIG. 5 illustrates embodiments of configuration register commands.

FIG. 5 illustrates an embodiment of configuration register commands 22. In some embodiments, the configuration register commands 22 may include a write configuration register command 23, a read configuration register command 24 and a reset command 25. When a NAND flash device according to an embodiment of the invention is connected to a NOR interface, as described above, these commands may be sent to the device, for example, by writing to a command portion of a virtual address space.

In some embodiments, a write configuration register command 23 may include from four to six cycles. During the first cycle, a first byte of the opcode for the write configuration register command 23 is written. In some embodiments, this first byte may be 55h. During the second cycle, a second byte of the opcode, for example AAh, is written. During the third cycle, for example, 03h, 02h or 01h is written, representing the number of data bytes that will be written to the configuration register. This byte may be issued as a command, for example with the CLE line high, or by being written to a command portion of a virtual address space, as described above. Next, the data bytes to be placed in the configuration register are written. The number of data bytes—one, two, or three—and therefore the number of additional cycles, is determined as described above. In some embodiments, the data bytes are written to a "data" portion of a virtual address space, as described above.

In some embodiments, a read configuration command 24 may include six cycles. As in the write configuration command 23, the first and second cycles may be spent writing a two-byte opcode for the command—55h AAh, in this example. Next, in the third cycle, a 00h is written, indicating that the configuration register is to be read, rather than written. During the next three cycles, three bytes of data are read, indicating the contents of the configuration register.

In some embodiments, a reset command 25 may be one cycle. In this example, the reset command 25 is issued by writing an FFh with the CLE line high (or by writing FFh to a command portion of a virtual address space). In some embodiments, the reset command 25 may be applied while the device is busy.

It will be understood that there may be many variations on the commands that have been described above. For example, in some embodiments, the opcodes for the commands to read or write the configuration register may be only a single byte, or may have values other than 55h AAh, and a reset command may use an opcode other than FFh. Additionally, depending on the number of bytes or words needed for the configuration register, either more or fewer than three bytes may be read or written to the configuration register, requiring varying numbers of cycles. Many other variations also are possible.

Standard NAND Interface

Figure 6:
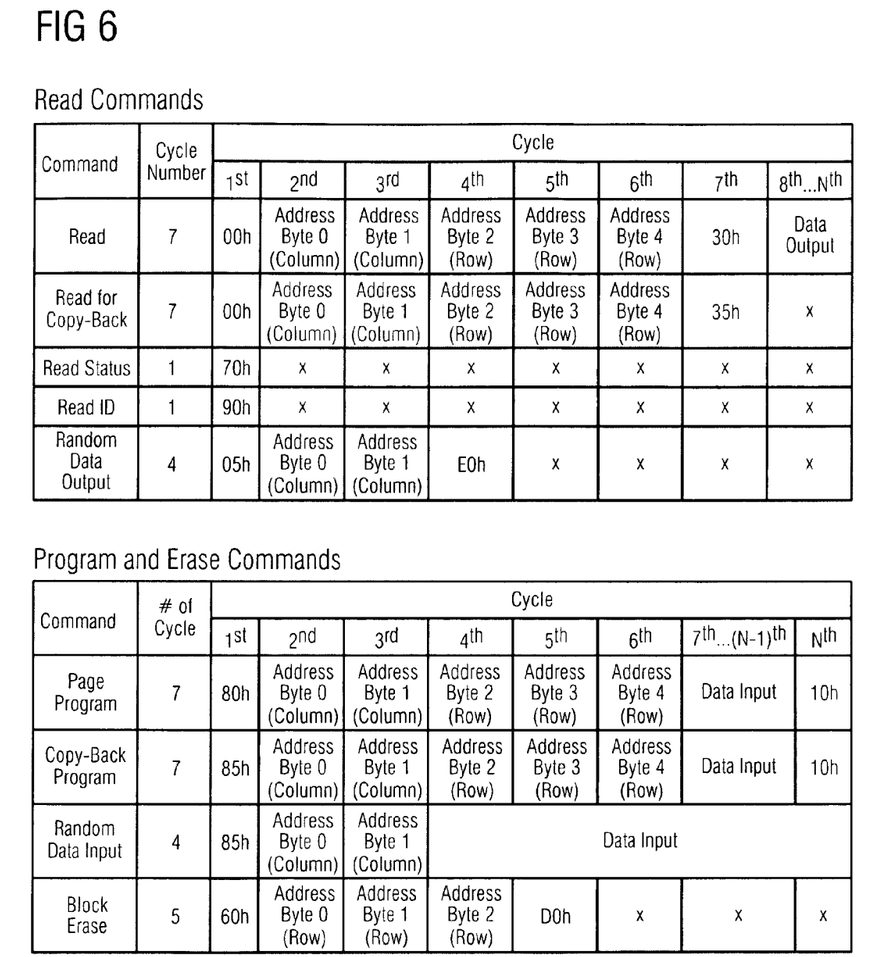
FIG. 6 illustrates embodiments of read commands, program commands and erase commands.

In some embodiments, the NAND-type flash memory may be compatible with a standard NAND asynchronous interface. FIG. 6 illustrates example commands of a NAND-compatible protocol. In some embodiments, the NAND-compatible protocol may be a modified industry standard NAND-compatible protocol, with commands substantially similar to those used on other NAND-type flash memory devices (though with additions, for example, to the configuration register, to permit switching to a NOR-compatible synchronous mode). In some embodiments, use of the standard NAND asynchronous interface may be determined by settings in the configuration register.

NOR-Compatible Synchronous Read Interface

In accordance with an embodiment of the invention, with the addition of one or more pins, such as a WAIT pin and/or a CLK pin, a NAND-type flash memory device can perform bus operations using a standard NOR flash interface, as is provided by some microprocessors. Among many other operations, including asynchronous read and write operations, this interface allows for synchronous burst read operations (with both single word and multiple word burst lengths), in which data read from the memory is output in bursts synchronized with the clock. In some embodiments, the NAND-type flash memory may be configurable by changing appropriate settings in the configuration register.

Figure 7:
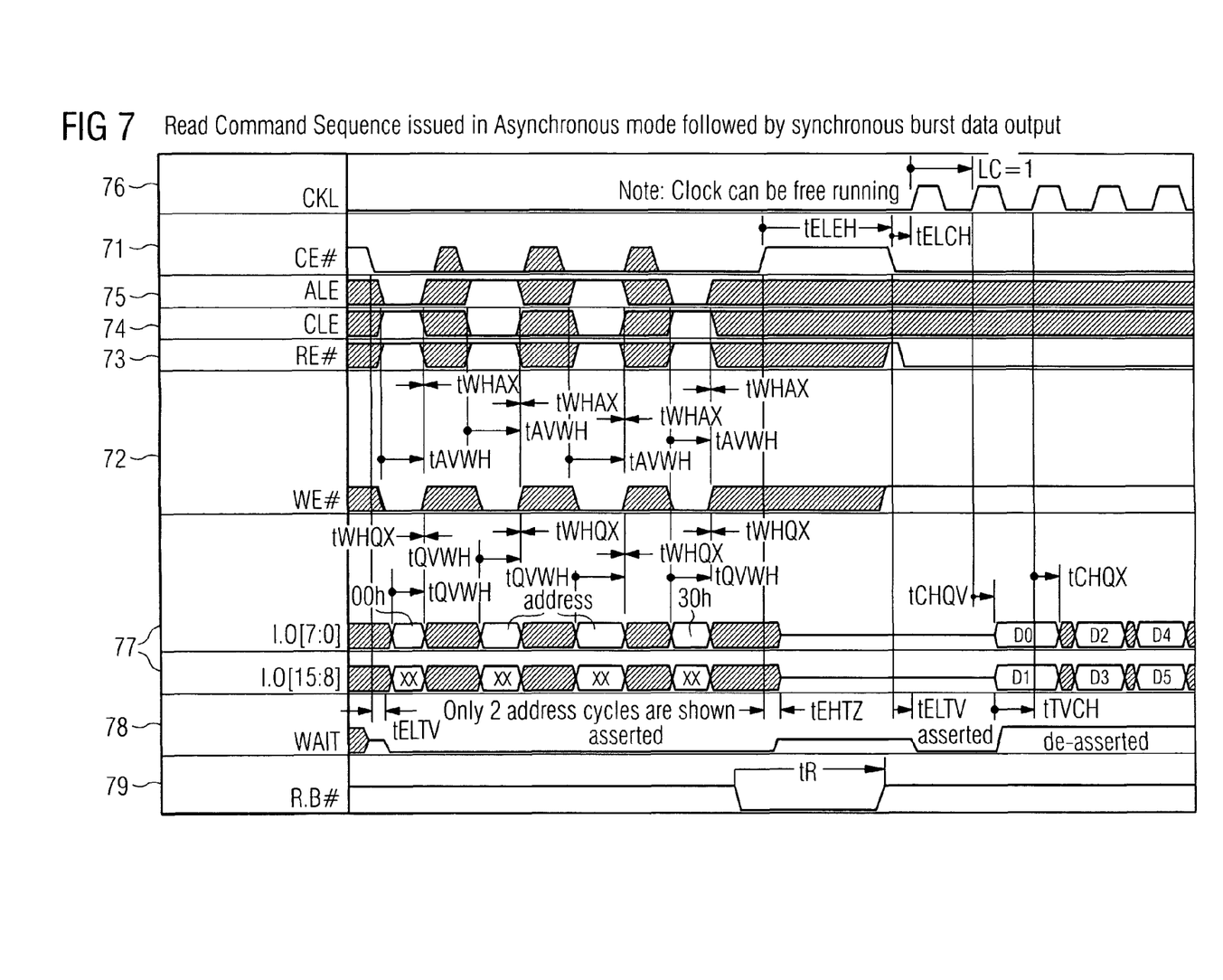
FIG. 7 illustrates an embodiment of a read command sequence issued in asynchronous mode followed by synchronous burst data output.

In a synchronous burst access, a bus controller generally reads multiple words of data before terminating the data access. FIG. 7, for example, illustrates an embodiment of waveforms 71-79 during synchronous burst read access, where the waveforms 71-79 correspond to waveforms at pins 51-59, as shown in FIG. 2. In FIG. 7, the read command sequence is issued in an asynchronous mode, followed by a synchronous burst data output. In some embodiments, this kind of synchronous burst access is used for data, but not for non-array reads, such as for reading the configuration register, status registers, device identification information, or other information that are not stored in the array of flash memory cells.

In some embodiments, when a flash memory is operated in Synchronous Burst access, data read from the memory array may be output in bursts synchronized with the clock signal 76 on the clock [CLK] pin. To start the read cycle, the CE# signal 71 may be asserted to enable read operations. Asserting the OE# signal (not shown) may activate the outputs and gates the selected data to the I/O bus. The address may be latched with standard ALE cycle, as shown in ALE signal 75 (where ALE is high), CLE signal 74 (where CLE is low), and the address data in I/O signals 77.

In some embodiments, following the read command and address, the first data may be output after a user-programmable number of clocks (initial latency—see, e.g., WAIT signal 78 and R/B# signal 79), determined in some embodiments by settings in the configuration register. Following this initial latency, as shown in CLK signal 76 and I/O signals 77, data may be output on the next valid (rising or falling—user selectable) clock edges until the end of the programmed burst length. In some embodiments, the address is linearly and automatically incremented by the NAND-type flash memory itself, so the bus controller may not need to change the address during the burst read. In some embodiments, to put the device into this mode, the appropriate bits may be set in the configuration register.

In some embodiments, the NAND-type flash memory may distinguish a read operation from a write operation by sampling the state of the WE# signal 72 (i.e., the signal on the WE# pin), CLE signal 74 (on the CLE pin), and ALE signal 75 (on the ALE pin) on the cycle after the CE signal 71 is asserted low (the standard NAND timings may be valid for this operation). In some embodiments, the ALE signal 75 and CLE signal 74 may be meaningful only when the WE# signal 72 is asserted low.

Input Operations

In some embodiments, the command input, address input and data input operations may be asynchronous write operations when viewed from the perspective of the host controller or processor. This may be the case even where the configuration register indicates that a synchronous read operation is enabled.

Data Output

In some embodiments, data output operations may be synchronous operations, for example completely synchronous operations, after the WAIT signal 78 indicates that valid data is ready. For example, the falling edge of the CE# signal 71 may initiate a burst read operation. The read latency period may be referenced from the first rising edge (or falling edge, depending on the configuration register settings) of the CLK signal 76 after the CE# signal 71 has been asserted low.

In some embodiments, the transfer of data from the internal page buffer to the data output latches may start on the falling edge of the CE# signal 71, even if the read could be aborted and the control signals (WE# signal 72, ALE signal 75 and CLE signal 74) could change to start a different operation, for example, a new command sequence.

It should be noted that in some embodiments, the synchronous interface parameters, such as latency and hold may apply even in the case of single data output. Additionally, in some embodiments, the data output should be in a high impedance state (High-Z) during the latency period, for example when the WAIT signal 78 is asserted.

In some embodiments, synchronous burst read may be allowed only for data read from the NAND-type flash memory array. Reading of other data from the device, such as the status register, configuration register, device identification, or other data that may be stored in memory other than the flash array, may be performed in single synchronous read mode, rather than synchronous burst mode.

Figure 8:
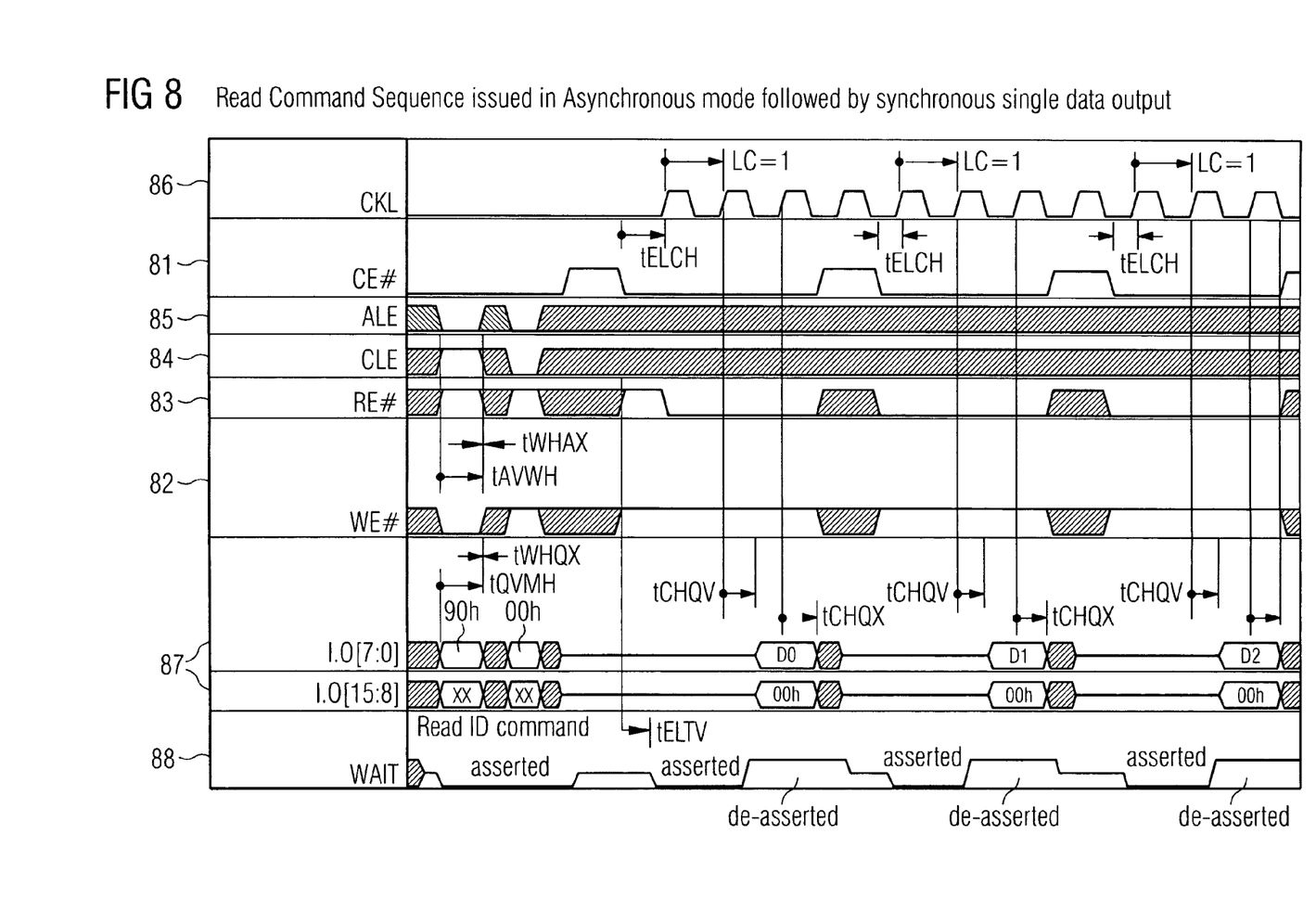
FIG. 8 illustrates an embodiment of a read command sequence issued in asynchronous mode followed by synchronous single data output.

An example of such a non-array read operation is illustrated in FIG. 8. Example waveforms 81-88 in FIG. 8 show signals used in accordance with an embodiment of the invention for an example read command sequence issued in asynchronous mode followed by synchronous single data output. In FIG. 8, a "Read ID" command is issued (see CLE signal 84, and I/O signals 87) in an asynchronous write mode. Following the command and a delay (see WAIT signal 88), three bytes of ID data (D0, D1, and D2) are synchronously output (see I/O signals 87 and CLK signal 86). Unlike in synchronous burst mode, there is a separate assertion of the CE# signal 81 for each byte or word of data output, and a separate latency period for each byte or word (see WAIT signal 88).

Page Program

Waveforms for a page program (or write) operation are not shown. Waveforms during a page program operation may be the same or similar with a page program operation of a standard NAND interface protocol. Waveform timings may be compliant with an asynchronous write operation of a standard NOR interface.

NAND Bus Turn-Around Examples

Figure 9:
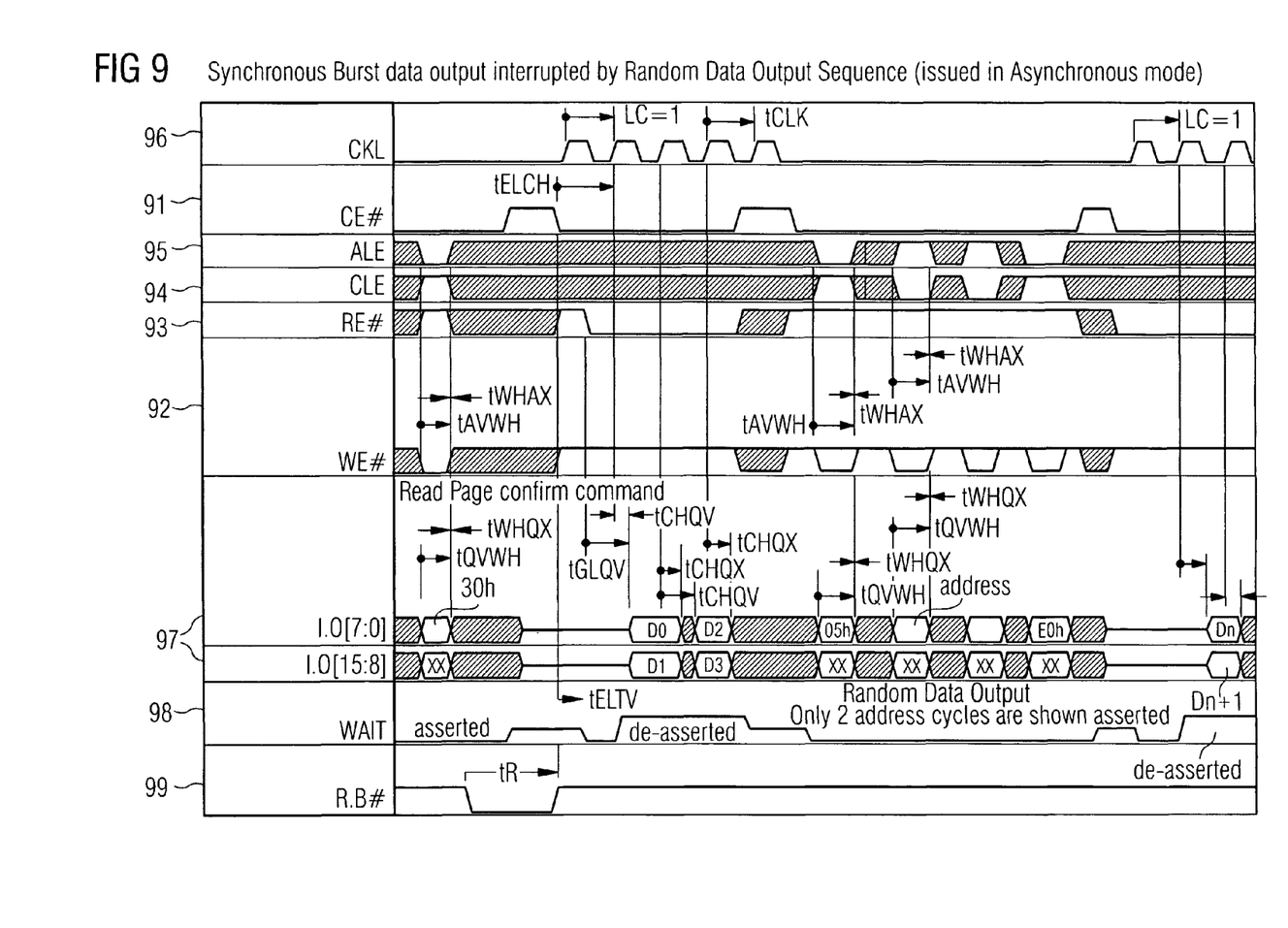
FIG. 9 illustrates an embodiment of a synchronous burst data output interrupted by random data output sequence.
Figure 10:
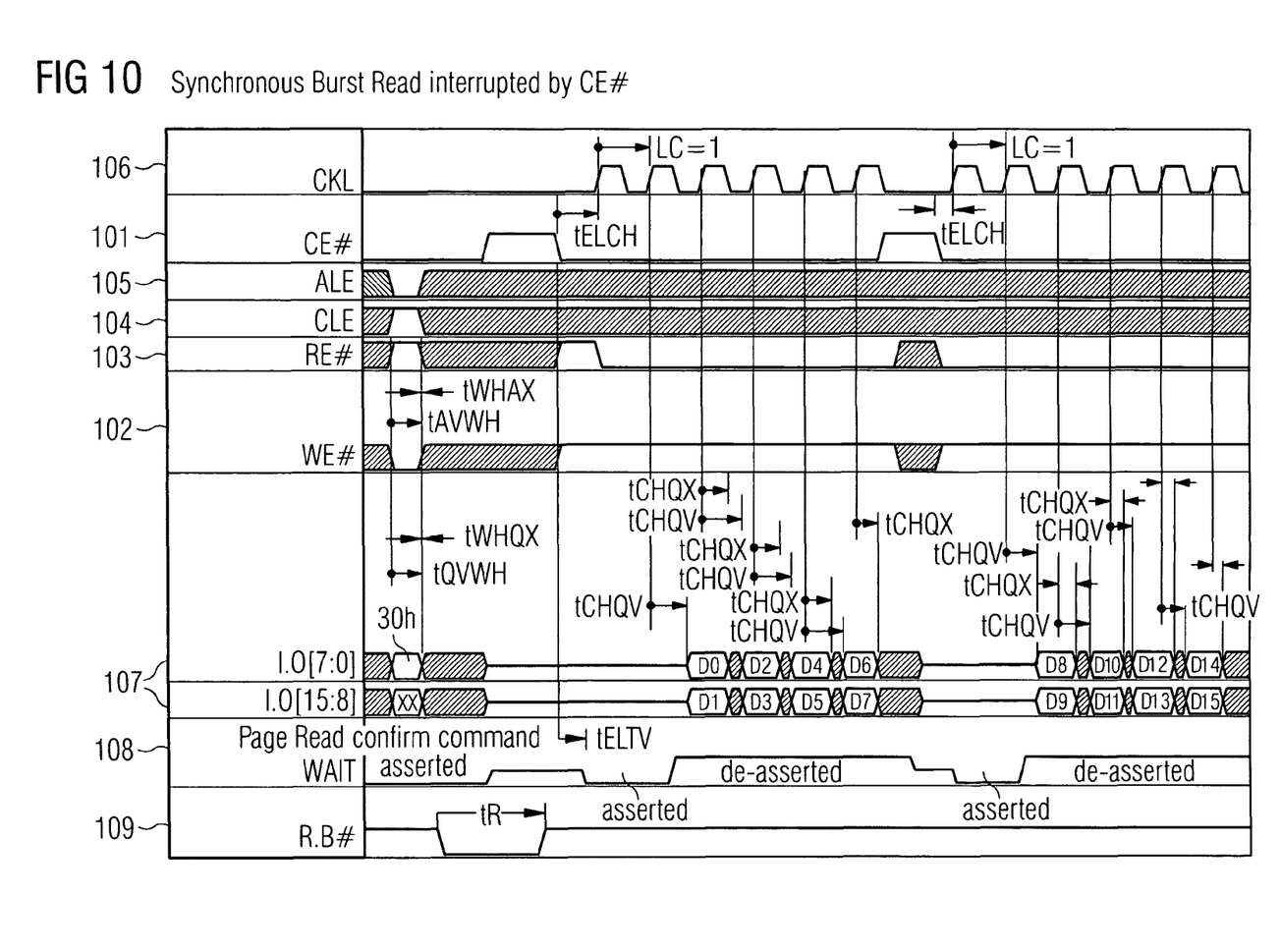
FIG. 10 illustrates an embodiment of a synchronous burst read interrupted by CE#.

FIGS. 9 and 10 illustrate example waveforms of NAND bus turn-around operations when operated with synchronous read interface. In an example bus turnaround operation, the state of the CE# pin may be toggled so the device may switch between various operational modes, for example switching from read mode to write mode. After the CE# falling edge, the CLE and ALE pins may be used to distinguish between command and address input phases if a valid write operation is detected, for example where WE# is low.

FIG. 9 illustrates example waveforms 91-99 of an example synchronous burst data output interrupted by a new command (a random data output sequence), issued in asynchronous mode. As can be seen, during a synchronous burst data output (see CLK signal 96, CE# signal 91, and I/O signals 97), the CE# signal 91 is de-asserted (i.e., set high), and then re-asserted (i.e., set low) to indicate an interruption of the synchronous burst mode. After the falling edge of the CE# signal 92, the CLE signal 94 is asserted, along with the WE# signal 92 to issue a new command. Issuing the command then proceeds in asynchronous mode, as usual.

FIG. 10 illustrates example waveforms 101-109 of an example read to read turnaround, for example synchronous burst read interrupted by CE#. As shown in FIG. 10, during a synchronous burst read operation (see CLK signal 106, CE# signal 101, and I/O signals 107), the CE# signal 101 is de-asserted (i.e., set high), and re-asserted (i.e., set low), interrupting the synchronous burst mode read operation. Because the WE# signal 107 is not asserted following the re-assertion of the CE# signal 101, the read operation is not being interrupted for a new command or address. Following a latency period (see WAIT signal 108), the synchronous burst mode read operation resumes (see CLK signal 106, CE# signal 101, and I/O signals 107).

WAIT Behavior

In some embodiments, the polarity and duration of the WAIT signal may be configured by setting appropriate bits in the configuration register. In some embodiments, the WAIT signal changes state on valid clock edges during active bus cycles.

Figure 11:
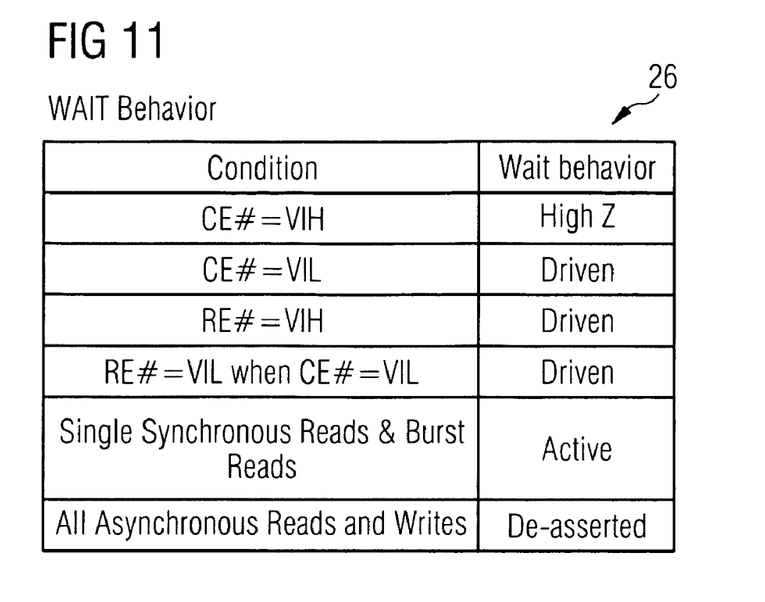
FIG. 11 illustrates an embodiment of WAIT behavior.

During a burst read operation, in some embodiments, the WAIT signal may function as illustrated by table 26 of FIG. 11. For example, table 26 shows that when the CE# signal is de-asserted (i.e., at a high voltage level, VIH), the WAIT signal is in a high impedance (High Z) state. When the CE# signal is asserted (i.e., at a low voltage level, VIL), the WAIT signal is "Driven", meaning that the WAIT output driver is turned on, and the logic level of the WAIT signal depends on the operational mode (e.g., synchronous or asynchronous read or write). The WAIT signal also is "Driven" when the RE# line is de-asserted, or when both RE# and CE# are asserted. In general, the WAIT signal may be active when the CE# signal is asserted.

The table 26 also shows that in some embodiments, during single synchronous reads and synchronous burst reads, the WAIT signal is in an "Active" state. In this "Active" state, WAIT is asserted until data becomes valid, and is then de-asserted. During asynchronous read and write operations, WAIT is de-asserted. It should be noted that in some embodiments, while WAIT is asserted, the I/O lines may be in a high impedance (High-Z) state.

Figure 12A:
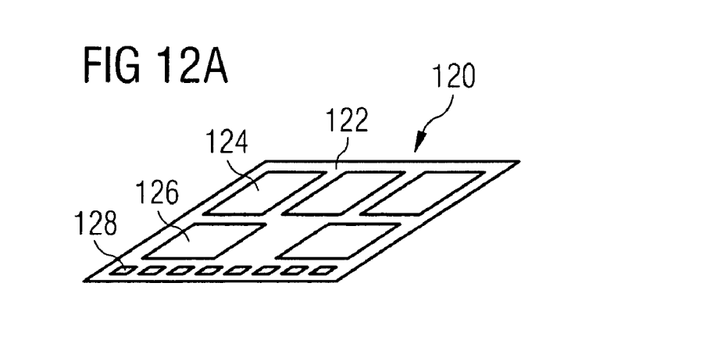
FIGS. 12A and 12B show a memory module including a memory device according to an embodiment of the invention.
Figure 12B:
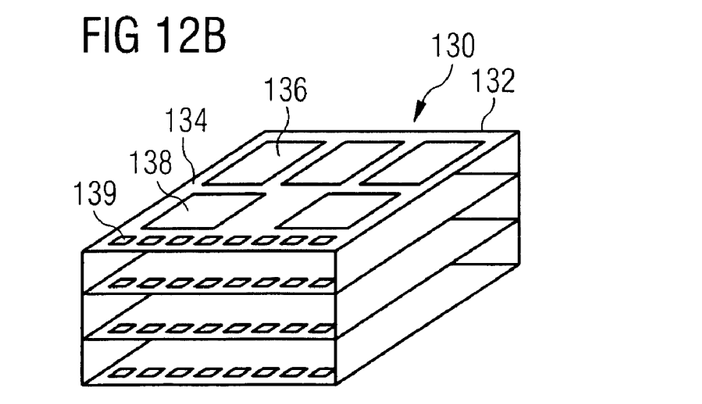

As shown in FIGS. 12A and 12B, in some embodiments, memory devices such as those described herein may be built as modules. In FIG. 12A, a memory module 120 is shown, on which one or more NAND flash memory arrays 124 are arranged on a substrate 122. Each such memory array 124 may include numerous NAND flash memory cells. The memory module 120 may also include one or more electronic devices 126, which may include memory, processing circuitry, control circuitry, addressing circuitry, bus interconnection circuitry, or other circuitry or electronic devices that may be combined on a module with a memory array 124, for example to implement the synchronous NAND or NOR-compatible protocols described above. Additionally, the memory module 120 includes multiple electrical connections 128, which may be used to connect the memory module 120 to other electronic components, including, for example, a NOR-compatible processor, or other modules. The electrical connections 128 may include the pins described above. In some embodiments, the memory module 120 may be plugged into a larger circuit board, including PC main boards, video adapters, cell phone circuit boards or portable video or audio players, among others, wherein such larger boards may include application hardware, such as is described above.

As shown in FIG. 12B, in some embodiments, these modules may be stackable, to form a stack 130. For example, a stackable memory module 132 may include one or more NAND flash memory arrays 136, arranged on a stackable substrate 134. Each of the NAND flash memory arrays 136 includes NAND flash memory cells. The stackable memory module 132 also may include one or more electronic devices 138, which may include memory, processing circuitry, control circuitry, addressing circuitry, bus interconnection circuitry, or other circuitry or electronic devices that may be combined on a module with a memory array 136, for example to implement the synchronous NAND or NOR-compatible protocols described above. Electrical connections 139 are used to connect the stackable memory module 132 with other modules in the stack 130, or with other electronic devices. Other modules in the stack 130 may include additional stackable memory modules, similar to the stackable memory module 132 described above, or other types of stackable modules, such as stackable processing modules, control modules, communication modules, or other modules containing electronic components.

While the invention has been particularly shown and described with reference to various embodiments, it will be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:
1. An integrated circuit memory device comprising:
a plurality of NAND-type flash memory cells; and
a synchronous NAND interface comprising
a single standard NAND flash interface pin arrangement and a clock (CLK) pin,
the single standard NAND flash interface pin arrangement comprising pins being configured to allow the single standard NAND flash interface pin arrangement of the synchronous NAND interface to perform as a NAND interface, and wherein the pins are further configured to interface with a NOR-compatible memory interface to allow the NAND interface to perform as a NOR interface; wherein the single standard NAND flash interface pin arrangement comprises an address latch enable (ALE) pin and a command latch enable (CLE) pin, and wherein a first address line of the NOR-compatible memory interface is directly connected to the CLE pin and a second address line of the NOR-compatible memory interface is directly connected to the ALE pin to create a virtual address space such that writing through the NOR-compatible memory interface to a first address causes the memory device to receive a command via data pins of the NAND interface, writing through the NOR-compatible memory interface to a second address causes the memory device to receive an address via data pins of the NAND interface, and writing through the NOR-compatible memory interface to a third address causes the memory device to receive data via data pins of the NAND interface.

2. The integrated circuit memory device of claim 1, wherein the NAND interface further comprises a WAIT pin.

3. The integrated circuit memory device of claim 1, further comprising a configuration register that comprises execution mode data, wherein the memory cells operate in an asynchronous mode when the execution mode data stores a first setting, and in a synchronous mode when the execution mode data stores a second setting.

4. The integrated circuit memory device of claim 3, wherein the memory device is compatible with a standard NAND asynchronous interface protocol when the memory cells are operating in the asynchronous mode.

5. The integrated circuit memory device of claim 3, wherein the memory device is compatible with a NOR-compatible interface protocol when the memory cells are operating in the synchronous mode.

6. The integrated circuit memory device of claim 1, wherein the memory device provides a synchronous burst read operation, in which output of data read from the memory device is synchronized with a signal on the clock pin.

7. The integrated circuit memory device of claim 6, wherein the synchronous burst read operation reads multiple data words before terminating data access.

8. An integrated circuit electronic device comprising:
a processor comprising a NOR-compatible memory interface that uses a NOR-compatible interface protocol; and
a NAND flash memory device comprising a plurality of NAND-type flash memory cells, and synchronous NAND interface and a clock (CLK) pin, the synchronous NAND interface comprising a single standard NAND flash interface pin arrangement comprising pins to allow the single standard NAND flash interface pin arrangement of the synchronous NAND interface to perform as a NAND interface wherein the pins are configured to be electrically connected to the NOR-compatible memory interface of the processor such that the NAND interface is arranged to perform as a NOR interface; wherein the single standard NAND flash interface pin arrangement comprises an address latch enable (ALE) pin and a command latch enable (CLE) pin, and wherein a first address line of the NOR-compatible memory interface is directly connected to the CLE pin and a second address line of the NOR-compatible memory interface is directly conencted to the ALE pin to create a virtual address space such that the processor writing through the NOR-compatible memory interface to a first address causes the NAND flash memory device to receive a command via data pins of the NAND interface, the processor writing through the NOR-compatible memory interface to a second address causes the NAND flash memory device to receive an address via data pins of the NAND interface, and the processor writing through the NOR-compatible memory interface to a third address causes the NAND flash memory device to receive data via data pins of the NAND interface.

9. The integrated circuit electronic device of claim 8, wherein the NAND flash memory device further comprises a WAIT pin that is electrically connected to a WAIT pin of the NOR-compatible memory interface.

10. The integrated circuit electronic device of claim 8, wherein the NOR-compatible interface protocol supports a synchronous burst read operation, and wherein the NAND flash memory device responds to the synchronous burst read operation by synchronizing the output of data read from the memory device with a clock signal.

11. The integrated circuit electronic device of claim 10, wherein the synchronous burst read operation reads multiple data words before terminating data access.

12. The integrated circuit electronic device of claim 8, further comprising application hardware.

13. The integrated circuit electronic device of claim 12, wherein the electronic device comprises a cellular telephone, and the application hardware comprises cellular communication hardware.

14. A method of manufacturing an integrated circuit memory device comprising:
providing a plurality of NAND-type flash memory cells; and
providing a synchronous NAND interface comprising a single standard NAND flash interface pin arrangement comprising pins and providing a clock (CLK) pin, configuring the pins to allow the single standard NAND flash interface pin arrangement of the synchronous NAND interface to perform as a NAND interface and further configuring the pins to also interface with a NOR-compatible memory interface as a NOR interface, the single standard NAND flash interface pin arrangement further comprising an address latch enable (ALE) pin and a command latch enable (CLE) pin;
directly connecting a first address line of the NOR-compatible memory interface to the CLE pin and directly connecting a second address line of the NOR-compatible memory interface to the ALE pin to create a virtual address space such that writing through the NOR-compatible memory interface to a first address causes the memory device to receive a command via data pins of the NAND interface, writing through the NOR-compatible memory interface to a second address causes the memory device to receive an address via data pins of the NAND interface, and writing through the NOR-compatible memory interface to a third address causes the memory device to receive data via data pins of the NAND interface.

15. The method of claim 14, wherein providing the synchronous NAND interface further comprises providing a WAIT pin.

16. The method of claim 14, further comprising providing a configuration register that comprises execution mode data, wherein the memory device operates in an asynchronous mode when the execution mode data stores a first setting, and in a synchronous mode when the execution mode data stores a second setting.

17. The method of claim 14, wherein providing a synchronous NAND interface further comprises providing a synchronous NAND interface that provides a synchronous burst read operation, in which output of data read from the memory device is synchronized with a signal on the clock pin.

18. A NAND-type flash memory device comprising:
a plurality of NAND-type flash memory cells; and
a synchronous NAND interface means for interfacing the NAND-type flash memory device to a NOR-compatible memory interface through a single standard NAND flash interface pin arrangement comprising pins arranged to allow performance of the single standard NAND flash interface pin arrangement as a NAND interface and also performance as a NOR interface; wherein the single standard NAND flash interface pin arrangement comprises an address latch enable (ALE) pin and a command latch enable (CLE) pin, and wherein a first address line of the NOR-compatible memory interface is directly connected to the CLE pin and a second address line of the NOR-compatible memory interface is directly connected to the ALE pin to create a virtual address space such that writing through the NOR-compatible memory interface to a first address causes the memory device to receive a command via data pins of the NAND interface, writing through the NOR-compatible memory interface to a second address causes the memory device to receive an address via data pins of the NAND interface, and writing through the NOR-compatible memory interface to a third address causes the memory device to receive data via data pins of the NAND interface.

19. The NAND-type flash memory device of claim 18, wherein the NAND interface means comprises a CLK pin and a WAIT pin.

20. The NAND-type flash memory device of claim 18, further comprising configuration means for storing execution mode data, wherein the NAND-tape flash memory device operates in an asynchronous mode when the execution mode data stores a first setting, and in a synchronous mode when the execution mode data stores a second setting.

21. The NAND-type flash memory device of claim 18, wherein the NAND-type flash memory device provides a synchronous burst read operation, in which output of data read from the memory device is synchronized with a signal on the clock pin.

22. A memory module comprising:
a NAND-type flash memory array; and
a plurality of electrical connections comprising a synchronous NAND interface that comprises a single standard NAND flash interface pin arrangement and a clock (CLK) pin, the single standard NAND flash interface pin arrangement comprising pins configured to allow the single standard NAND flash interface pin arrangement to perform as a NAND interface and wherein the pins are further configured to interface with a NOR-compatible memory interface to allow the single standard NAND flash interface pin arrangement to perform as a NOR interface; wherein the single standard NAND flash interface pin arrangement comprises an address latch enable (ALE) pin and a command latch enable (CLE) pin, and wherein a first address line of the NOR-compatible memory interface is directly connected to the CLE pin and a second address line of the NOR-compatible memory interface is directly connected to the ALE pin to create a virtual address space such that writing through the NOR-compatible memory interface to a first address causes the memory device to receive a command via data pins of the NAND interface, writing through the NOR-compatible memory interface to a second address causes the memory device to receive an address via data pins of the NAND interface, and writing through the NOR-compatible memory interface to a third address causes the memory device to receive data via data pins of the NAND interface.

23. The memory module of claim 22, wherein the memory module provides a synchronous burst read operation, in which output of data read from the memory array is synchronized with a signal on the clock pin.

* * * * *